United States Patent
Kim

[11] Patent Number: 5,952,690
[45] Date of Patent: Sep. 14, 1999

[54] THIN FILM TRANSISTOR AND FABRICATION METHOD OF THE SAME

[75] Inventor: Hong Sun Kim, Daejeonjikhal-si, Rep. of Korea

[73] Assignee: LG Semicon Co., Ltd., Chungcheongbuk-do, Rep. of Korea

[21] Appl. No.: 08/914,765

[22] Filed: Aug. 20, 1997

Related U.S. Application Data

[62] Division of application No. 08/527,008, Sep. 12, 1995, Pat. No. 5,693,549.

[30] Foreign Application Priority Data

Sep. 13, 1994 [KR] Rep. of Korea .................... 94-23066

[51] Int. Cl.⁶ ................................................. H01L 27/788
[52] U.S. Cl. ............................................ 257/316; 257/315
[58] Field of Search .................................... 257/315, 316

[56] References Cited

U.S. PATENT DOCUMENTS

| | | |
|---|---|---|
| Re. 35,810 | 5/1998 | Prall . |
| 5,407,848 | 4/1995 | Park et al. . |
| 5,483,094 | 1/1996 | Sharma et al. . |
| 5,508,544 | 4/1996 | Shah . |
| 5,753,951 | 5/1998 | Geissler . |

OTHER PUBLICATIONS

T. Zhao et al., "A Novel Floating Gate Spacer Polysilicon TFT", International Electron Devices Meeting, pp. 393–396 (1993).

*Primary Examiner*—Stephen D. Meler
*Attorney, Agent, or Firm*—Finnegan, Henderson, Farabow, Garrett & Dunner, L.L.P.

[57] ABSTRACT

A thin film transistor is provided on a insulative substrate and includes a polysilicon body film having a ridge portion formed on a predetermined portion of the substrate. A first gate insulation film, a main gate and a cap oxide film are successively formed on the ridge portion of the polysilicon body. A second gate insulation film is provided over the entire substrate surface covering the ridge portion and side surface of the gate insulation film, main gate and cap oxide film. Supplementary gates are then provided on the second gate insulation film adjacent respective sides of the ridge portion. Source and drain regions are then formed in portions of the polysilicon body film exposed by the main gate and the supplementary gates. Channel or offset regions can be formed in the polysilicon body film near the supplementary gates, thereby increasing channel length while minimizing area occupied by the transistor. A highly integrated device having reduced short channel effects can thus be achieved.

10 Claims, 5 Drawing Sheets

THIN FILM TRANSISTOR AND FABRICATION METHOD OF THE SAME

This is a division of application Ser. No. 08/527,008, filed Sep. 12, 1995, now U.S. Pat. No. 5,693,549.

BACKGROUND OF THE INVENTION

This invention relates to a thin film transistor used in a static random access memory (SRAM), and more particularly to a thin film transistor and related fabrication method, which are suitable for large scale integration.

Thin film transistors have been used as load resistors in one megabyte (1M) SRAM memory cells, and as switching elements for operating pixels in an LCD.

To insure proper operation of the SRAM cell, the on/off current ratio of the thin film transistor should be increased. Preferably, this is achieved by increasing turn on current while decreasing turn off current. Thus, power consumption of the SRAM element can be reduced and memory characteristics of the SRAM element can be improved.

Recently, methods for fabricating transistors having improved on/off current ratios have been proposed. One such method will now be explained with reference to FIGS. 1a–1d.

Figure 1A:
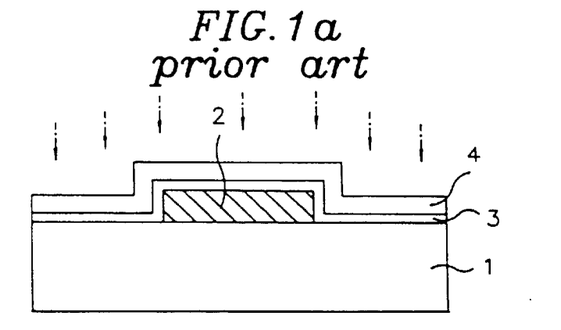
FIGS. 1a to 1d illustrate a method for forming a conventional offset type thin film transistor.

FIG. 1a illustrates a first step in a process for fabricating an offset type thin film transistor. As seen in FIG. 1a, a gate 2 is formed by depositing a polysilicon film on an insulation substrate 1. The gate is then patterned with a photoetching process.

A gate insulation film 3 is then deposited on insulative substrate 1, and gate 2 is formed thereon. Gate 2 is formed by a chemical vapor deposition (CVD) process. In addition, a layer of polysilicon 4 is provided on gate insulation film 3. Ions are then implanted into polysilicon layer 4 for threshold voltage adjustment.

Figure 1B:
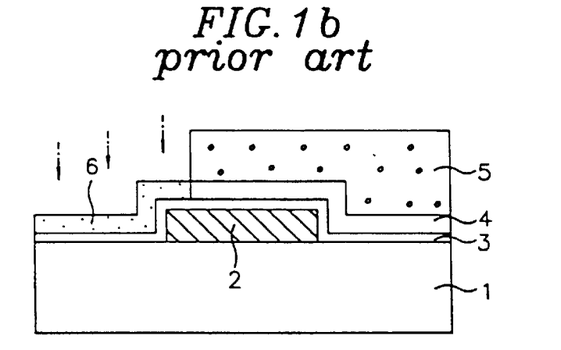
Figure 1C:
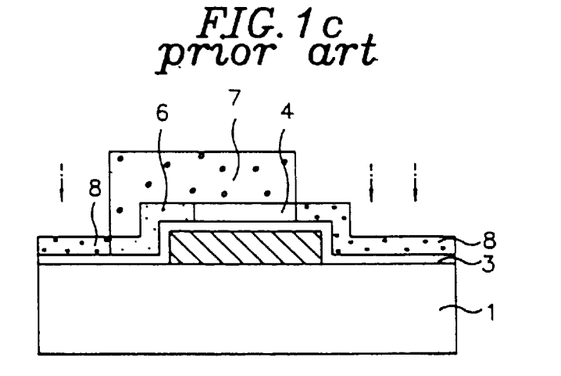

As shown in FIG. 1b, a photosensitive pattern 5 is formed on a portion of polysilicon film 4, while other portions, corresponding to a subsequently formed offset LDD (Lightly Doped Drain) region, remain exposed. The offset of the LDD region 6 is then formed in the body polysilicon film 4 at one side of the gate 2 by implanting impurity ions into the exposed polysilicon film 4, using photosensitive pattern 5 as an implantation mask. As shown in FIG. 1c, the photosensitive pattern 5 is removed, and another photosensitive pattern 7 is provided on polysilicon film 4 for forming source/drain regions 8.

Figure 1D:
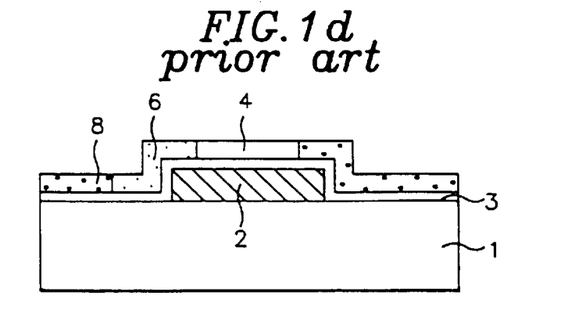

Source/drain regions 8 are formed in polysilicon film 4 by implanting impurity ions having the same conductivity type as LDD region 6 into the polysilicon or polysilicon body film 4. In this step, photosensitive pattern 7 serves as an implantation mask. As shown in FIG. 1d, photosensitive pattern 7 is removed, resulting in a conventional thin film transistor having an offset structure.

In the conventional thin film transistor shown in FIG. 1d, a long channel length is required for assuring satisfactory element characteristics. On the other hand, large scale integration of the SRAM cell continues to advance, resulting in smaller device structures requiring that the channel length be reduced.

As the transistor size is scaled down and the channel length is reduced, however, transistor characteristics degrade significantly. Thus, transistor size has been a limiting factor in achieving large scale integration in SRAM chips. Further, the photoetching process defining the length of the offset region, causes a serious length change, which results in poor memory cell characteristics.

FIGS. 2a–2d illustrate an alternative conventional method for fabricating a thin film transistor.

Figure 2A:
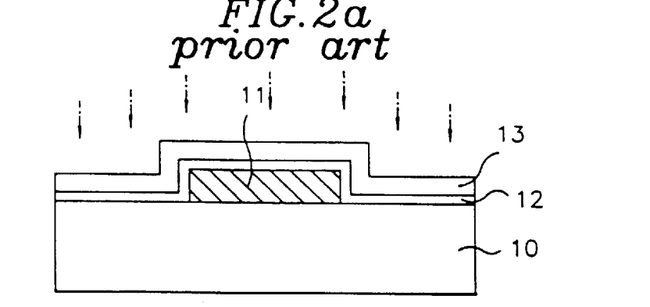
FIGS. 2a to 2d illustrate process steps for forming a conventional LDD structured thin film transistor.

Referring to FIG. 2a, a gate 11 is first formed on an insulation substrate 10. A gate insulation film 12 is then formed on the entire substrate surface, and a polysilicon body in the form of a film 13 is respectively formed thereon. After forming polysilicon body 13, impurity ions are implanted into polysilicon body 13 for threshold voltage adjustments.

Figure 2B:
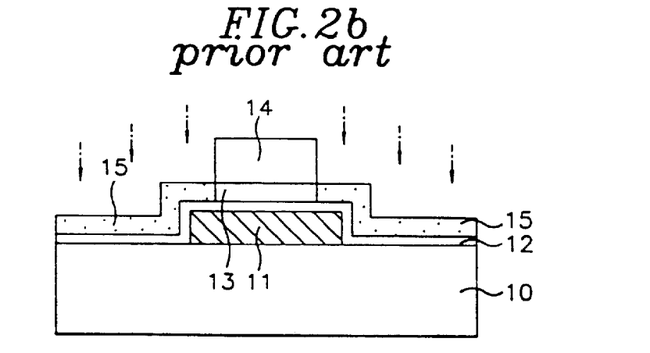

As shown in FIG. 2b, LDD regions 15 are next formed in the polysilicon body 13 on opposite sides of the gate 11 by providing a photosensitive pattern 14 on the polysilicon body 13, and implanting impurity ions into polysilicon body 13 using photosensitive pattern 14 as an implantation mask.

Figure 2C:
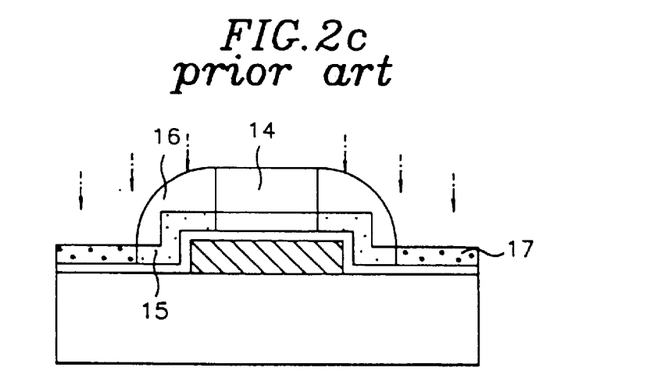

Referring to FIG. 2c, spaces 16 are formed on opposite sides of the photosensitive pattern 14 by forming first an oxide film on the entire substrate surface and then etching back the oxide film in an appropriate manner. High density source/drain regions 17 are formed in the polysilicon body 13 by implanting impurity ions having the same conductivity type as the LDD regions 15 in polysilicon film 13. Photosensitive pattern 14 and spacers 16 are used as implantation masks in this step.

Figure 2D:
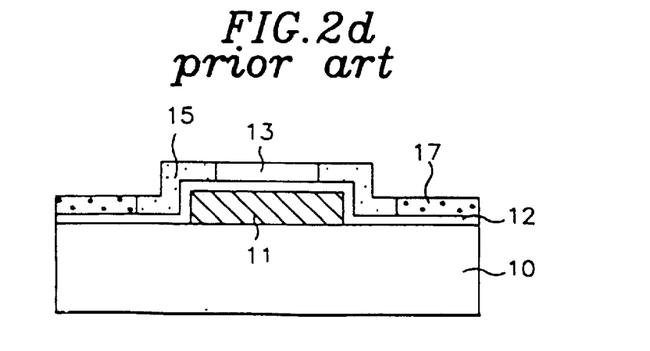

As shown in FIG. 2d, a conventional thin film transistor having an LDD structure is thus obtained by removing oxide film spacers 16 and photosensitive pattern 14.

The conventional LDD thin film transistor shown in FIG. 2d is advantageous in that it can eliminate the photoetching step used to fabricate the offset type thin film transistor shown in FIGS. 1a to 1d. However, the process for fabricating the LDD thin film transistor includes the steps of oxide film fabrication, oxide film spacer process, and removal processes. Fabrication of the LDD thin film transistor is therefore complication. Further, the size of the oxide film spacers suffers from poor reproducibility.

SUMMARY OF THE INVENTION

The object of this invention is to provide a thin film transistor which can use parts of a polysilicon body film under supplementary gates formed on both sides of a gate as channel regions or offset regions. An additional object of the present invention is to provide a method for fabricating the thin film transistor.

Another object of this invention is to provide a thin film transistor suitable for large scale integration, and a related method of fabrication.

Another object of this invention is to provide a thin film transistor which can prevent short channel effects by increasing the available channel lengths, even within the limited area of the thin film transistor.

A further object of the present invention is to provide a thin film transistor having an improved on/off current ratio.

These objects are achieved in accordance with the present invention by providing a thin film transistor comprising a substrate having a surface and a semiconductor layer including a raised first portion and a second portion formed on a predetermined part of the surface of the substrate. The raised first portion has first and second side surfaces and a top surface. A first gate insulation film is formed on the top surface of the first raised portion of the semiconductor layer. A main gate layer is formed on the first gate insulation film, and a cap insulation film is formed on the main gate layer. The first gate insulation film, main gate layer, and cap insulation film each have first and second side portions.

The thin film transistor further includes a second gate insulation film overlying at least said first and second side portions of said main gate layer and said first and second side surfaces of said raised portion of said semiconductor layer. A first supplementary gate is formed on the second gate insulation film and overlying the first side portion of the first gate insulation film, the main gate layer and the cap insulation film, as well as the first side surface of said raised portion. A second supplementary gate is formed on the second gate insulation film overlying the second side portion of the first gate insulation film, the main gate layer, and the cap insulation film, and the first side surface of the raised portion. Source and drain regions are further provided in the second portion of the semiconductor layer exposed by the main gate layer and the first and second supplementary gates.

Further, in accordance with the present invention, a method for manufacturing a thin film transistor comprising the steps of first depositing a polysilicon film on a substrate and then removing selected portions of the polysilicon film, thereby forming a patterned polysilicon layer. Next, a first gate insulation film is formed on the patterned polysilicon layer and the substrate, and a first polysilicon film is formed on the first gate insulation film. A cap insulation film is then formed on the first polysilicon film.

A gate is next formed by successively photoetching the cap insulation film, the first polysilicon film, and the first gate insulation film. A raised portion having first and second side surfaces is then formed in the patterned polysilicon layer by etching selected portions thereof.

A second gate insulation film is provided on the substrate, the gate, and the first and second side surfaces of the raised portion, and a second polysilicon film is formed on the second gate insulation film. The second polysilicon film is then etched back to form first and second supplementary gates as sidewall spacers adjacent the first and second side surfaces, respectively; and source and drain regions are formed in self-aligned fashion by implanting impurity ions into the polysilicon film using the gate and the first and second supplementary gates as a mask.

In the event that the main gate and each of the supplementary gates act as individual terminals and the above-described thin film transistor is turned on, all parts of the polysilicon body film under the main gate between the source/drain regions and the supplementary gates act as channel regions. When the thin film transistor is turned off and a back bias is applied to one of the supplementary gates, parts of the polysilicon body film under the main gate and supplementary gates having no applied back bias act as channel regions. In addition, part of the polysilicon body film under the supplementary gate having the back bias applied thereto acts as an offset region.

Further, when (1) the thin film transistor is turned on, (2) the main gate and one of the supplementary gates act as a common terminal, and (3) the rest of the supplementary gates act as individual terminals, and parts of the body polysilicon film under the main gate between the source/drain regions and the supplementary gates act as channel regions. When the thin film transistor is turned off and a back bias is applied to the supplementary gates corresponding to the individual terminals, however, parts of the polysilicon body film under the supplementary gates corresponding to the individual terminals act as offset regions, and parts of the polysilicon body film under the main gate and the supplementary gate corresponding to the common terminal act as channel regions.

DETAILED DESCRIPTION OF THE INVENTION

Figure 3:
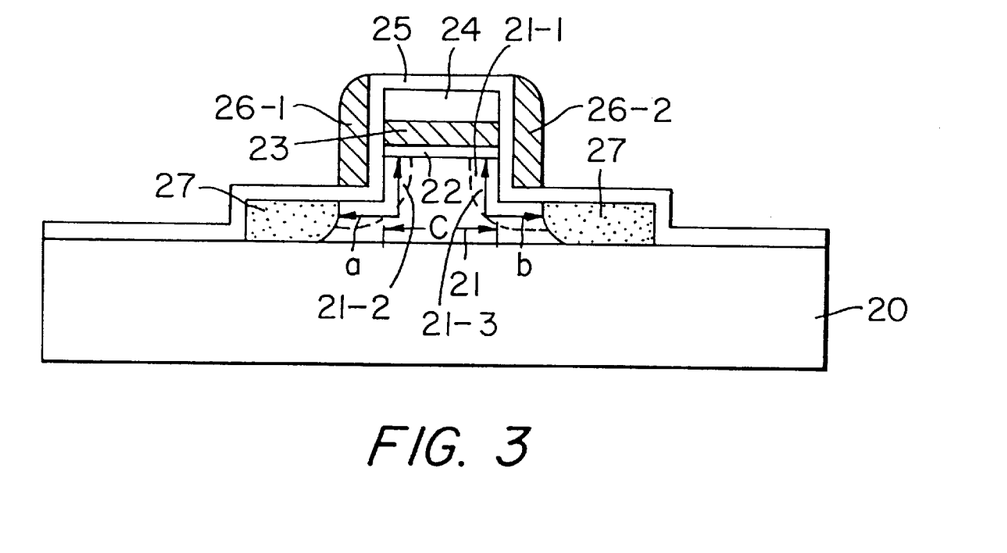
FIG. 3 illustrates a cross-view sectional of a thin film transistor in accordance with a first embodiment of the present invention.

FIG. 3 is a sectional view of a thin film transistor in accordance with a first embodiment of this invention.

As shown in FIG. 3, the thin film transistor includes a polysilicon body film 21 having a raised portion or ridge part 21-1 formed on a predetermined part of insulation substrate 20. A first gate insulation film 22 is provided on the ridge part 21-1 of polysilicon body film 21, and a main gate 23 is formed on gate insulation film 22. In addition, cap oxide film 24 is provided on main gate 23. Further, a second gate insulation film 25 is formed on the entire substrate surface including polysilicon body film 21 and main gate 23.

As further shown in FIG. 3, supplementary gates 26-1 and 26-2 are respectively provided on portions of second gate insulation film 25 covering opposite sides of cap oxide film 24, main gate 23, first gate insulation film 22 and ridge part 21-1 of polysilicon body film 21. Lightly doped offset (LDO) regions 21-2 and 21-3 may be provided in ridge part 21-1 respectively adjacent supplementary gates 26-1 and 26-2. Further, source and drain regions 27 are preferably formed in portions of polysilicon body film 21 not covered by gates 26-1 and 26-2.

Since the thin film transistor in accordance with the first embodiment is formed to have polysilicon gates 26-1 and 26-2 on opposite sides of ridge part 21-1 in the polysilicon body film, the available channel length can be increased by lengths a and b of polysilicon body film 21 shown in FIG.3.

Generally, operation of the thin film transistor in accordance with the first embodiment of the present invention can be divided in two cases. In one case, the main gate 23 and all of the supplementary gates 26 act as individual terminals. In the other case the main gate 23 and one of the supplementary gates 26-1 and 26-2 act as a common terminal, and the other supplementary gate acts as an individual gate.

First, the case where the main gate 23 and all of the supplementary gates 26 act as individual terminals will now be explained. When the thin film transistor is turned on, a forward bias is applied to main gate 23 and the supplementary gates 26-1 and 26-2. Accordingly, channels form in portions of polysilicon body film 21 adjacent main gate 22 and supplementary gates 26-1 and 26-2. The total channel length of this device under these conditions is equal to the sum of the lengths a, b, and c seen in FIG. 3.

When the device is turned off, channel regions and offset regions (regions beneath a gate electrode where there is no channel) are formed depending on the voltage applied to the supplementary gates 26. In particular, in the event that main gate 23 and one of the supplementary gates 26-1 and 26-2 (e.g. 26-1) have no applied bias, while a backward bias is applied to the other supplementary gate (e.g. 26-2), the portion of polysilicon body film adjacent supplementary gate 26-2 becomes an offset region having length b, and portions of polysilicon body film 21 adjacent main gate 22 and supplementary gates 26-1 become channel regions having a total channel length c+a.

Similarly, if the TFT is turned off and a backward bias is applied to gate 26-1 and no bias is applied to supplementary gate 26-2, an offset region is formed adjacent supplementary gate 26-1 having length a. Further channels regions are formed adjacent main gate 22 and supplementary gate 26-2 having lengths c and b, respectively. The total channel length in this case becomes b+c.

The case where the main gate 23 and one of the supplementary gates 26-1 and 26-2 act as a common terminal, and the other supplementary gate acts as an individual terminal will now be explained.

Suppose that the main gate 23 and the supplementary gates 26-1 act as a common terminal, and supplementary gate 26-2 acts as an individual terminal, when the device is turned on, a forward bias is supplied to main gate 23. In addition, a forward bias is applied to supplementary gates 26-1 of the common terminal, as well as to supplementary gate 26-2 of an individual terminal. Portions of polysilicon body 21 adjacent the gate become channel regions have lengths a, b, and c, respectively. The total channel length, therefore, is a+b+c.

When the device is turned on and main gate 23 and supplementary gates 26-1 constituting a common terminal receive no bias, and the supplementary gate 26-2 of an individual terminal receives a backward bias, the portion of polysilicon body 21 adjacent to supplementary gate 26-2 becomes an offset region having length b. Channel regions, however, are formed adjacent supplementary gate 26-1 and main gate 23, and each have length c and a, respectively. The total channel length in this case is c+a.

When the main gate and the supplementary gates are used as individual terminals, channel regions are formed adjacent these gates depending on which ones receive a forward bias. In the event one of the supplementary gates 26-1 and 26-2 together with the main gate are used as individual terminals, portions of polysilicon body 21 adjacent the supplementary gates always act as offset regions.

The thin film transistor in accordance with the first embodiment of this invention has a polysilicon body film having a mesa shape, and supplementary gates are provided separate from and on opposite sides of the main gate. Accordingly, not only the portion of polysilicon body 21 adjacent to the main gate 23 having length c, but also portions adjacent the supplementary gates having lengths a and b can be used as channel regions. Thus, the thin film transistor of the first embodiment includes channel regions having lengths a and b in addition to the channel region having length c. In contrast, the conventional offset or LDD type thin film transistor includes a channel region only adjacent its main gate having channel length c. This feature is advantageous in improving integration.

Moreover, in the case where portions of polysilicon body 13 adjacent supplementary gates 26-1 and 26-2 act as offset regions, the turn off current is lower than that associated with the offset type thin film transistor, and the on/off current ratio is increased accordingly. In addition, inversion layers can be formed in these portions of polysilicon body 13 to constitute LDD regions, thereby minimizing short channel effects.

A method for fabricating the thin film transistor in accordance with the first embodiment of the present invention will now be explained with reference to FIGS. 4a to 4d.

Figure 4A:
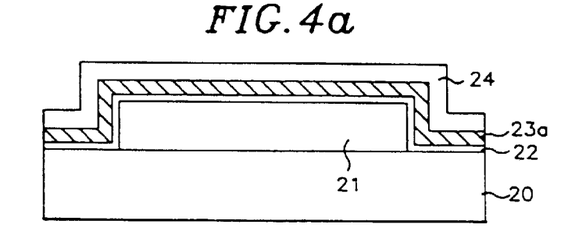
FIGS. 4a to 4e illustrate process steps in accordance with the present invention for forming the thin film transistor shown in FIG.3.

Referring to FIG. 4a, a polysilicon film is deposited on an insulation substrate 20, and impurity ions for threshold voltage adjustment are implanted into the polysilicon film. The polysilicon film is then patterned to form a polysilicon body film 21. A first gate insulation film 22, a polysilicon film 23a (to form the main gate), and a cap insulation film 24 are formed successively on the entire substrate 20 including polysilicon body film 21.

Figure 4B:
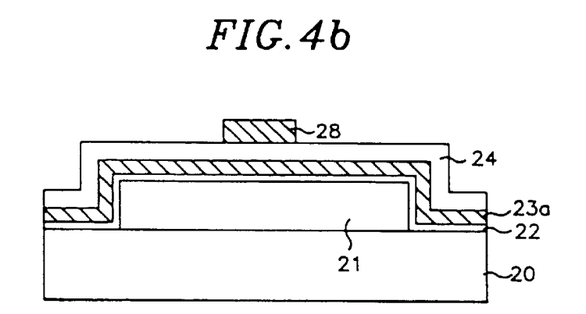

As shown in FIG. 4b, a photosensitive film pattern 28 for selectively etching the gate electrode is formed by coating a photosensitive film on the cap insulation film 24 and subjecting it to photoetching.

Figure 4C:
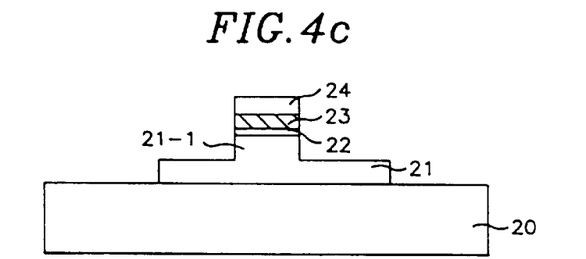

Next in FIG. 4c, gate 23 is formed by etching the cap insulation film 24, the polysilicon film 23a, and the first gate insulation film 22 using photosensitive film pattern 28 as a mask. A ridge part 21-1 of the body polysilicon film 21 is formed by anisotropically etching the polysilicon body film 21 to a predetermined depth. At this point, if an LDD structure is desired, it can be formed by implanting impurity ions into polysilicon body 21 using the gate as a mask.

Figure 4D:
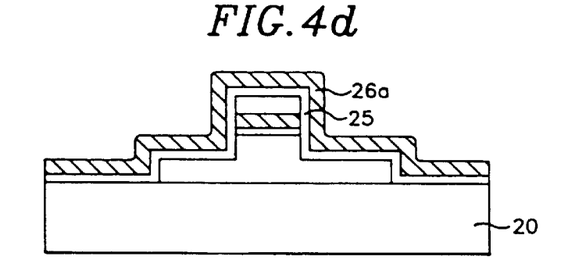

As shown in FIG. 4d, the second gate insulating film 25 is formed over the entire substrate surface including ridge 21-1, and side surfaces of gate insulation film 22, gate 23, and cap oxide 24. As further shown in FIG. 4d, second gate insulation film 25 is also formed on the top surface of cap oxide 24. Polysilicon film 26a is next formed over the entire exposed surface of second gate insulation film 25.

Figure 4E:
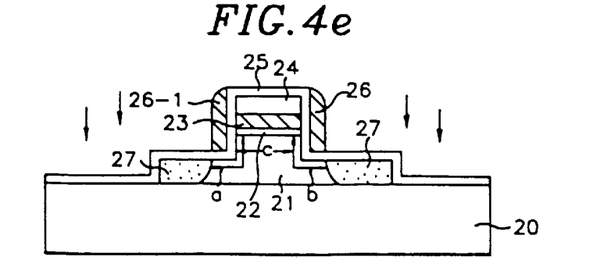

Referring to FIG. 4e, supplementary gates 26-1 and 26-2 are formed as side wall spacers on both sides of the ridge part of the polysilicon body film 21 by subjecting the polysilicon film 26a to an etch back process. Alternatively, if supplementing gates 26-1 and 26-2 are to be connection in common, the portion of polysilicon film 26a overlying the top surface of cap insulation film 24 (See FIG. 4d) can be masked so that it is not removed during the etch back process. In addition, supplementary gate 261 can be patterned so that it extends over the cap insulation film 24.

Source/drain regions 27 are then formed by implanting impurity ions into the substrate using main gate 23 and the supplementary gates 26 as masks. As a result, a thin film transistor in accordance with the first embodiment of this invention is formed as shown in FIG. 4e.

In the foregoing method for forming the thin film transistor, the source/drain regions are formed reproducibly by implanting ions in a self-aligned process using the main gate and the supplementary gates as masks.

Although supplementary gates 26-1 and 26-2 are spaced apart on opposite sides of the main gate 23 in FIG. 4e, they can be connected to each other by not etching that portion of the supplementary gate forming polysilicon film formed on cap oxide film 24. Alternatively one supplementary gate can be formed only on one side of the main gate 23.

Figure 5:
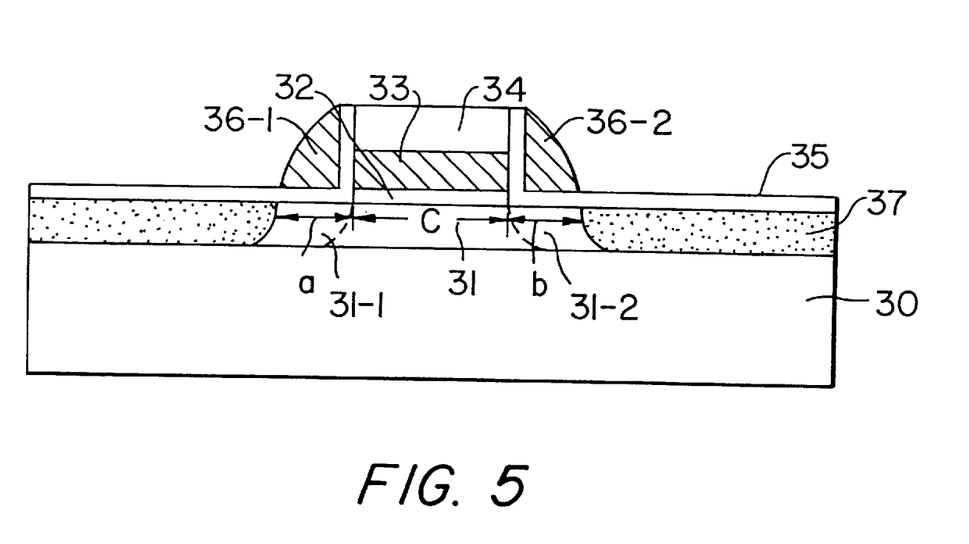
FIG. 5 is a cross-sectional view of a thin film transistor in accordance with a second embodiment of this invention.

FIG. 5 shows a sectional view of a thin film transistor in accordance with a second embodiment of this invention.

This thin film transistor includes an insulative substrate 30, and a body polysilicon film 31 formed on the insulative substrate 30. A first gate insulation film 32 is formed on a predetermined portion of the body polysilicon film 31, and main gate 33 is provided on the gate insulation film 32. A cap oxide film 34 is formed on gate 33, and a second gate insulation film 35 is provided on the polysilicon body film 31 and on opposite sides of the cap oxide film 34, main gate 33, and first gate insulation film 32. Supplementary gates 36-1 and 36-2 are formed on portions of second gate insulation film 35 covering side surfaces of cap oxide film 34, main gate 33, and first gate insulation film 32. Source and drain regions 37 are then formed within the polysilicon body film 31, except beneath the main gate 33 and the supplementary gates 36-1 and 36-2.

LDO regions 31-1 and 31-2 may be provided adjacent supplementary gates 36-1 and 36-2, respectively, by implanting impurity ions into said polysilicon body film 31 using cap oxide film 34, main gate 33, and first gate insulation film 32 as a mask.

As in the thin film transistor in accordance with the first embodiment of this invention, the thin film transistor in accordance with the second embodiment also has portions in polysilicon body film 31 of lengths a and b adjacent to the supplementary gates 36-1 and 36-2 for providing additional channel regions and increasing the available channel length.

The thin film transistor in accordance with the second embodiment has advantages compared to the conventional offset or and LDD type thin film transistors, which include having a high degree of integration, high on/off current ratio, and reduced short channel effects.

However, the thin film transistor in accordance with the second embodiment has the added advantage of a coplanar channel, whereas the thin film transistor in accordance with the first embodiment has a mesa formed body polysilicon film with vertical channel regions.

The method for fabricating the thin film transistor in accordance with the second embodiment is identical with the first embodiment except it does not require the etching process of the polysilicon body film, which simplifies the overall fabrication process.

Operation of the thin film transistor in accordance with the second embodiment is identical with the first embodiment.

In summary, the thin film transistor in accordance with the present invention improves integration by forming supplementary gates on opposite sides of a main gate, and by using portions of a body polysilicon film under the gates as offset regions. In case parts of the body polysilicon film under the supplementary gates regions are used as channel regions, short channel effects are prevented as in an LDD device. However, parts of the polysilicon body film under the supplementary gates regions can also be used as offset regions, thereby improving the on/off current ratio and reducing power consumption as well as improving memory characteristics.

In addition, by implanting impurity ions in a self-aligned process without separate masking steps, the source/drain regions can be formed simply and reproducibly.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A thin film transistor comprising:
    a substrate having a surface;
    a semiconductor layer having a raised first portion and a second portion formed on a predetermined part of said surface of said substrate, said raised first portion having first and second side surfaces and a top surface;
    a first gate insulation film formed on said top surface of said first raised portion of said semiconductor layer, said first gate insulation film having first and second side portions;
    a main gate layer formed on said first gate insulation film, said main gate layer having first and second side portion;
    a cap insulation film formed on said main gate layer, said cap insulation film having first and second side portions;
    a second gate insulation film overlying at least said first and second side portions of said main gate layer, and said first and second side surfaces of said raised portion of said semiconductor layer;
    a first supplementary gate formed on said second gate insulation film and overlying said first side portion of said first gate insulation film, said main gate layer and said cap insulation film, and said first side surface of said raised portion;
    a second supplementary gate formed on said second gate insulation film and overlying said second side portion of said first gate insulation film, said main gate layer and said cap insulation film, and said first side surface of said raised portion;
    a source region and a drain region formed in said second portion of said semiconductor layer exposed by said main gate layer and said first and second supplementary gates.

2. A thin film transistor in accordance with claim 1 further comprising:
    a first LDO region in said raised portion of said semiconductor layer adjacent said first supplementary gate; and
    a second LDO region in said raised portion of said semiconductor layer adjacent said second supplementary gate.

3. A thin film transistor in accordance with claim 1, wherein said first and second supplementary gates are spaced from each other by said main gate layer.

4. A thin film transistor in accordance with claim 1, wherein said first and second supplementary gates are connected to each other via a connecting portion overlying said cap insulation film.

5. A thin film transistor in accordance with claim 1, wherein a portion of said first supplementary gate extends over said cap insulation film and contacts said second supplementary gate.

6. A thin film transistor comprising:
    a substrate;
    a semiconductor layer formed on said substrate;
    a first gate insulation film formed on a predetermined portion of said semiconductor layer, said first gate insulation film having first and second side portions;
    a main gate layer formed on said first gate insulation film, said main gate layer having first and second side portions;
    a cap insulation film formed on said main gate layer, said cap insulation film having first and second side surfaces and a top surface;
    a second gate insulation film formed on said first and second side portions of said first gate insulation film, said main gate layer, and said cap insulation film, leaving said top surface of said cap insulation film exposed;
    a first supplementary gate formed on a first portion of said second gate insulation film, said first side surface of said first gate insulation film, said main gate layer and said cap insulation film;
    a second supplementary gate formed on a first portion of said second gate insulation film, said second side surface of said first gate insulation film, said main gate layer and said cap insulation film;
    a source region and a drain region formed in said second portion of said semiconductor layer exposed by said main gate layer and said first and second supplementary gates.

7. A thin film transistor in accordance with claim 6, further comprising:
   a first LDO region in said semiconductor layer adjacent said first supplementary gate; and
   a second LDO region in said semiconductor layer adjacent said second supplementary gate.

8. A thin film transistor in accordance with claim 6, wherein said first and second supplementary gates are spaced from each other by said main gate layer.

9. A thin film transistor in accordance with claim 6, wherein said first and second supplementary gates are connected to each other via a connecting portion overlying said cap insulation film.

10. A thin film transistor in accordance with claim 6, wherein a portion of said first supplementary gate extends over said cap insulation film and contacts said second supplementary gate.

* * * * *